United States Patent
Sevachko

Patent Number: 5,719,797
Date of Patent: Feb. 17, 1998

[54] SIMULATOR FOR SMART MUNITIONS TESTING

[75] Inventor: Mark D. Sevachko, Las Cruces, N. Mex.

[73] Assignee: The United States of America as represented by the Secretary of the Army, Washington, D.C.

[21] Appl. No.: 573,165

[22] Filed: Dec. 15, 1995

[51] Int. Cl.[6] ........................................... G06F 15/16
[52] U.S. Cl. .................... 364/578; 364/132; 364/164; 364/724.1; 364/724.12; 364/819; 364/825; 395/200.01; 395/500; 395/800
[58] Field of Search .................. 395/500, 97, 200.01, 395/800; 364/578, 148, 164, 174, 724.1, 724.12, 724.05, 819, 825, 132, 232.3, 230.4, DIG. 1

[56] References Cited

U.S. PATENT DOCUMENTS

| | | | |
|---|---|---|---|
| 3,741,502 | 6/1973 | Schroader et al. | 244/3.13 |
| 3,903,521 | 9/1975 | Jensen et al. | 342/168 |
| 4,204,210 | 5/1980 | Hose | 342/25 |
| 4,351,025 | 9/1982 | Hall, Jr. | 395/500 |
| 4,471,465 | 9/1984 | Mayer et al. | 395/131 |
| 4,650,926 | 3/1987 | Nakamura et al. | 178/18 |
| 4,683,572 | 7/1987 | Baggen et al. | 371/37 |
| 4,851,854 | 7/1989 | Drogin | 342/417 |
| 5,135,397 | 8/1992 | Yen | 434/2 |
| 5,226,000 | 7/1993 | Moses | 364/724.1 |

*Primary Examiner*—Kevin J. Teska
*Assistant Examiner*—Thai Phan
*Attorney, Agent, or Firm*—Muzio B. Roberto; Frank J. Dynda

[57] ABSTRACT

A missile or other smart munitions simulator uses an analog function simulator to simulate the detector signal of the missile's optical tracking components. The analog function simulator stores convoluted scene data for respective ranges between the missile and the 'target' it is tracking. The scene data are stored in respective data matrices, and may correspond to the target itself or to the background. Depending on the value of variables produced during the missile tracking simulation, the analog function simulator accesses elements in the data matrices and interpolates between them, thereby producing an analog signal which simulates the detector signal of the missile's optical tracking components.

3 Claims, 9 Drawing Sheets

INDEPENDENT MODE:

EXTENDED MODE:

4-D MODE:

SLAVE READ/WRITE MEMORY TIMING:

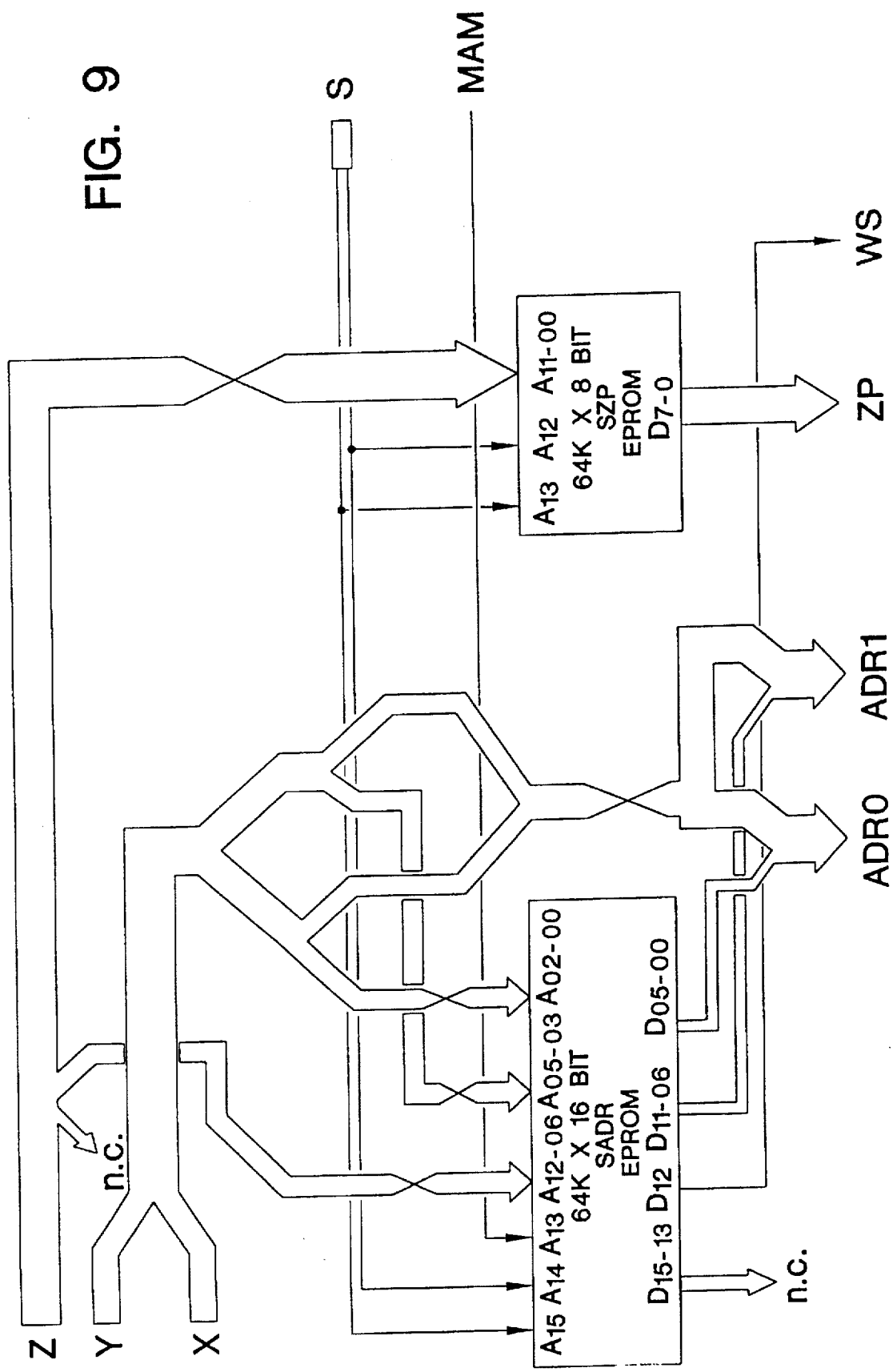

SIMULATOR FOR SMART MUNITIONS TESTING

BACKGROUND OF THE INVENTION

The present invention relates to a method and apparatus for performing tracking simulations in a smart munitions system. More specifically, the present invention relates to an analog function simulator for simulating a detector signal of a target detector assembly in a smart munitions system.

When designing and building any type of complex hardware, one must be able to test it prior to production. In addition, for most complex designs, prototype hardware is built first and tested to verify unique concepts and designs. Furthermore, after completion of a limited production run, further testing may be desired to improve the product. A smart munitions system, such as a missile system, is most assuredly a complex hardware and for its various design and production phases, the munitions system must be thoroughly tested—both with prototype and production hardware.

Of course with a military system, such as a missile weapons system, the testing must be rigorous and thorough. When testing hardware such as a surface-to-air (anti-aircraft) missile, many missiles and targets (airplanes) will be expended. The cost of accomplishing this can be ridiculously expensive. Even if one ignores the costs, real-world testing of missile systems are many times an engineering nightmare as each flight will have different atmospheric conditions, different sky/cloud backgrounds, different target characteristics, etc. which really cloud the results when one is performing parametric optimizations.

Using computerized simulations, subsystems in a smart munitions system may be mathematically modeled and the appropriate equations generated and implemented in a computer program, with the testing being done in front of a keyboard and terminal screen. Computerized simulations would require mathematical modeling of the entire munitions system, such as optical elements, magnetic coils, seeker electronics, gyroscopes, wing servo electronics, and missile propulsion and aerodynamics. In addition, warhead effects, atmosphere, target aircraft, and the munitions launcher would need to be modeled. That done, the cost of munitions testing would be greatly diminished—instead of firing real missiles and destroying real aircraft, for example, only bytes in memory would be modified.

Unfortunately, there are drawbacks. Using the current state-of-the-art computers, a 10-second actual missile flight may take 10 hours of computer computation time. In addition, every change in the missile's design would require new programs to be written ( ... and tested ... and verified).

A method that almost all missile designers utilize today is a compromise between the two methods. Computer models are generated and programs written for those subsystems which are relatively well behaved and easily modeled and not likely to change. The other subsystems are not modeled but the actual hardware is used. The two classes of subsystems are married together with A/D and D/A converters and other special laboratory equipment. With this method (called hardware-in-the-loop or HWIL) all the computer programs must run in real-time since actual physical hardware is used. Real-time means that a 10-second actual missile flight is simulated with 10 seconds of actual computer (and hardware) time. This real-time constraint requires fast computers and careful programming in addition to fast special laboratory equipment.

SUMMARY OF THE INVENTION

Accordingly, a primary object of the present invention is to provide an improved simulator for smart munitions tracking.

It is a further object of the present invention to provide a method and apparatus for simulating an analog function generator.

These and other objects of the present invention are fulfilled by providing an analog function simulator comprising memory storage means for storing at least two data matrices; an address decoder operatively connected to said memory storage means, for generating address signals for accessing at least two elements from the stored data matrices; first interpolator means for interpolating between at least two elements accessed by said address decoder and for producing a first interpolated result; and first conversion means for receiving the first interpolated result and for generating an analog interpolated signal.

Also in a preferred embodiment, the analog function simulator is used to aid in said smart munitions tracking simulations in which the smart munitions track a target. The analog function simulator may include slave simulator modules and a master simulator module, to form a multimode analog function simulator for simulating a detector signal of a target detector assembly in a smart munitions.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 9 is a schematic block diagram illustrating an address decoder module.

DESCRIPTION OF PREFERRED EMBODIMENTS

The Redeye, Stinger, and Chaparral are examples of electro-optical surface-to-air U.S. Army missile systems.

The infrared (IR) energy emitting from a flying aircraft is used by these missiles for detection and homing. In the case of the Stinger RMP, the ultraviolet (UV) silhouette of the aircraft against the sky is also used for detection and homing. The present invention is a fast special laboratory equipment, preferably used for performing HWIL missile simulations, equally capable of modeling the UV characteristics of the target as well as the IR characteristics, but the discussion below will be constrained to the IR spectral wavelength band. It should also be understood, that although the description below is directed to a missile tracking or homing simulation, the present invention is not so limited, and may be used for other smart munitions simulations, or as a general purpose analog function generator.

Figure 1:
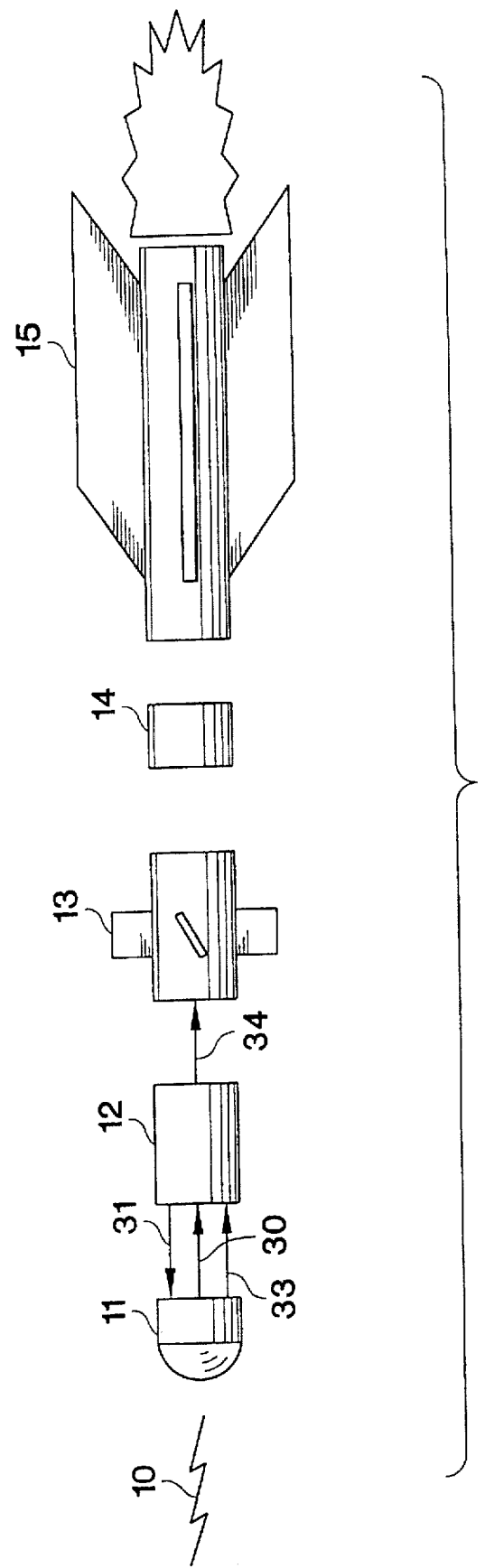
FIG. 1 is an exploded diagram illustrating the components of an actual missile.

Referring to FIG. 1, there is generically illustrated an electro-optical missile. In the front end of the missile 11, the IR detector assembly is mounted on the end of a gyroscope (to decouple the detector from the missile's airframe). The detector converts IR energy 10 received from the target to an electrical detector signal 30 which is used by the tracking electronics with an electro-magnetic servo mechanism to keep the gyroscope pointing at the target. The gyroscope is magnetized and is steered via electrical signals that energize various coils in the front of the missile. The detector assembly also contains some means of modulating the IR energy that falls on the detector. For newer missiles, additional scanning mirrors are placed in the IR path so that the whole field in front of the missile is scanned in some pattern. For older missiles, a spinning reticle is placed in the IR path so that the IR energy 10 is chopped in some particular manner.

The missile's guidance electronics utilizes signals from the tracking electronics to produce a signal to drive the wing (or canard) servo mechanism. This wing command signal 34 causes the wing (or canard) servo mechanism 13 to move the wings (or canards) which cause the missile to change its flight path in the atmosphere. The seeker electronics 12 includes the tracking electronics and the guidance electronics. The other sections shown in FIG. 1—the warhead 14 and rocket motor and tailfins 15—are self-explanatory.

Figure 2:
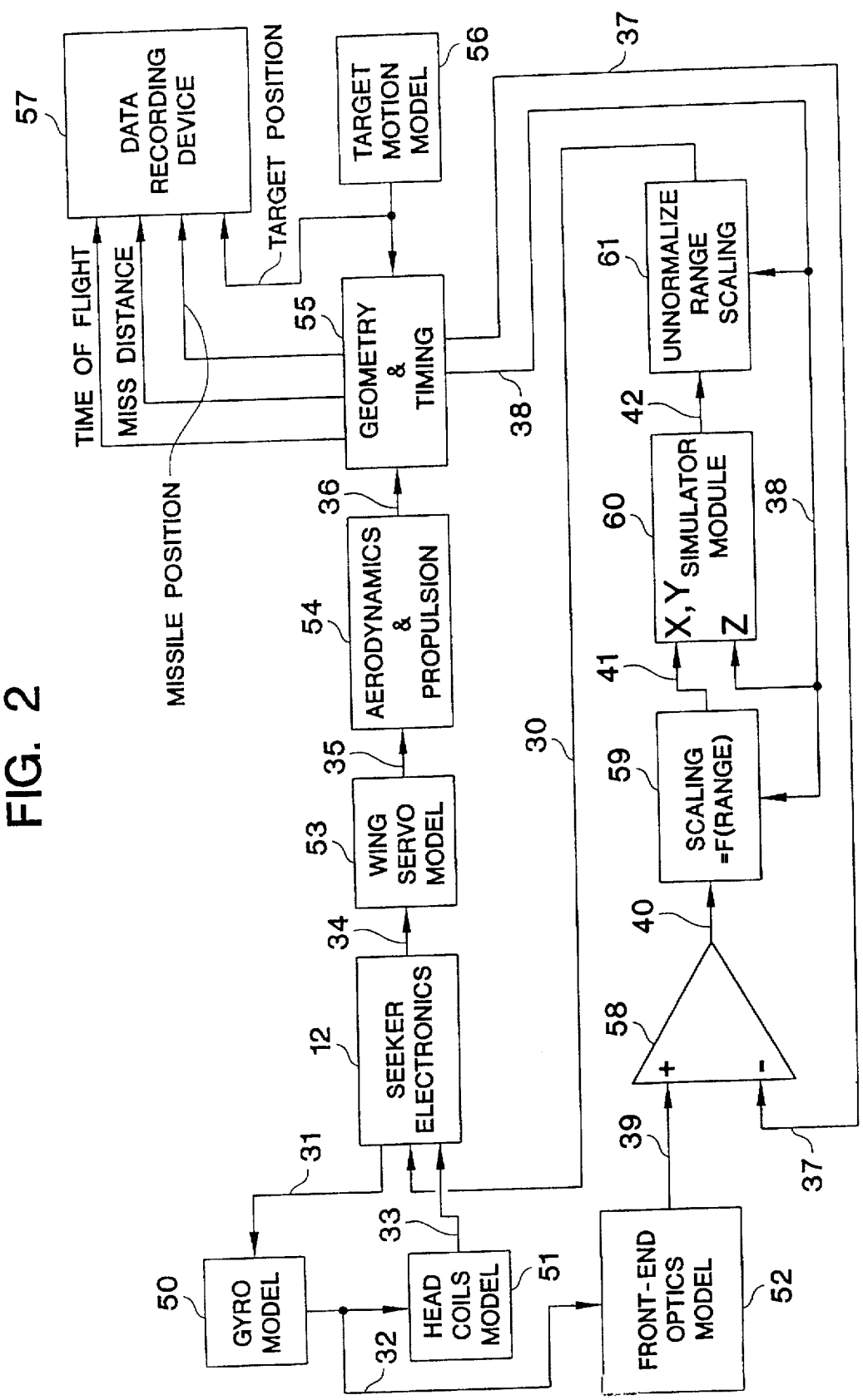
FIG. 2 is a schematic block diagram illustrating a HWIL simulator for an imaging missile in which the present invention could be utilized.

FIG. 2 shows a block diagram of a HWIL simulation for an imaging missile according to the present invention. The seeker electronics 12 is identical to the missile section in the previous figure, and constitutes the "hardware" in the HWIL. Except for the simulator module 60 and the seeker electronics, all other blocks in FIG. 2 are modeled on computers, which can include analog, special purpose digital, general purpose digital, etc. The gyro command signals 31 output by the seeker electronics 12 drive a gyro model 50 that generates the position of the gyro. The gyro position 32 in turn drives a head coils model 51 that produces the magnetic pickup signals 33 to feedback to the seeker electronics 12. The gyro position 32 is also input to the front-end optics model 52 to produce a direction (detector line-of-sight, LOS) signal 39 of where the missile detector is "looking."

The other output of the seeker electronics 12 is the wing command 34 that drives the wing servo model 53 that determines the wing deflection. This wing deflection 35 is input to the aerodynamics (and propulsion) model 54 to determine the missile's angular and linear velocities 36 in the air. A target motion model 56 generates the position of the target aircraft in the air. A geometry and timing model 55 then computes the difference between these two flying objects and produces a relative LOS signal 37, and a range signal 38.

The relative LOS is then differenced 58 with the detector LOS 39, described above, to produce the LOS error signals 40. These LOS error signals signify the difference between where the target is and where the missile is "looking," and may include azimuthal and elevational components, etc. If the missile was "looking" right at the target then these LOS error signals would be zero. These LOS error signals 40 are then scaled by a function of range 38 by a scaling function 59 into scaled LOS error signals 41. The scaled error signals 41 drive the X and Y inputs of the simulator module 60. The range signal 38 is used to drive the Z input to the simulator module 60. The output of the simulator module 60 is a normalized detector signal 42 that is unnormalized via another function of range 61. This unnormalizing may include inverse range squared scaling and atmospheric transmission characteristics. Finally, the unnormalized detector signal 30 drives the seeker electronics and "closes the loop."

Figure 3:
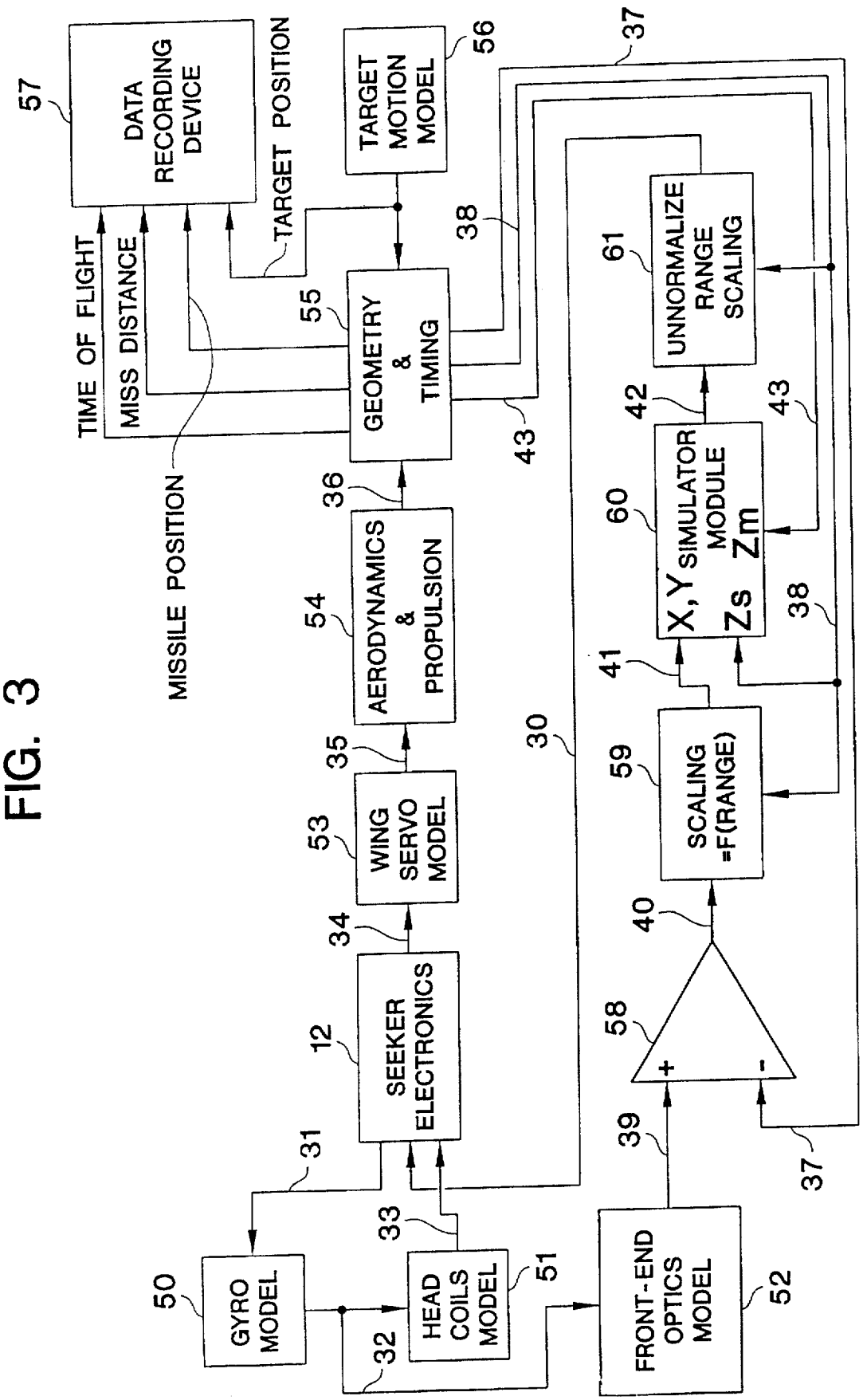
FIG. 3 is a schematic block diagram illustrating a HWIL simulator for a reticle-type missile in which the present invention could be utilized.

For reticle-type missiles, the block diagram of FIG. 3 is used. This Figure is identical to FIG. 2, except for an additional roll position output signal 43 from the geometry model 55 which is used to drive the Zm input of the simulator module 60; the range signal 38 drives the Zs input to the simulator module 60; and some of the signals may be named differently to correspond to reticle-type missiles.

In FIGS. 2 and 3, a data recording device 57 may be used to monitor the simulation.

The simulator module 60 includes a memory that is addressed by the values of the potentials on its X, Y, and Z inputs. (Operation of the simulator module 60 including its Zm and Zs inputs will be described later.) The memory contents is converted from digital to analog form and is then output from the simulator module. In its simplest form, the memory includes $2^K$ layers of $2^M \times 2^M$ matrices. The values for K and M depend on various configuration factors and will be described later.

Figure 4:
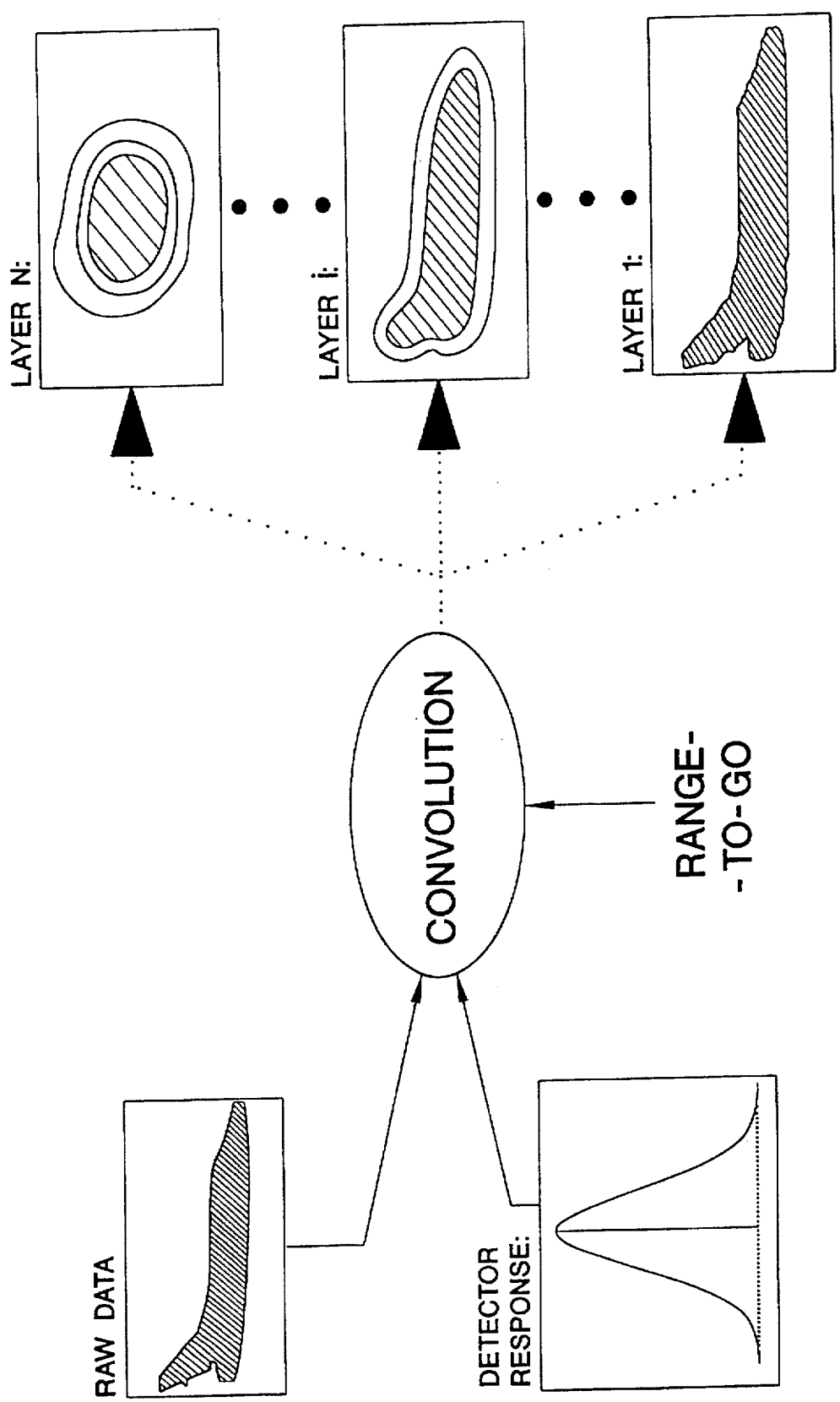
FIG. 4 shows the convoluted data matrices used in the present invention.

On the top left of FIG. 4 is shown a pictorial representation of typical raw data—data that represent the intensity of the scene being modeled. It should be recognized that the scene data in a simulator module could equally be used for target or background scenes. Also, the simulator module could be used for modeling any wavelength (or band) of energy so long as it has optical properties and thus could be used for any IR, visible, or UV wavelength band. For the example shown in FIG. 4, the scene is UV target scene. The raw data shown should not be construed as a picture of the target scene but rather as a data matrix where each element represents the intensity of the target scene (in the wavelength band of the missile's detector) in the area represented by the element.

The raw data matrix is then mathematically convoluted with another matrix that represents the point-source detector spatial response. This convolution is a function of the range-to-the-target and produces another data matrix for each value of range. If these data are normalized and plotted with some gray scale representing data values, the three plots on the right of FIG. 4 will result. These normalized data matrices are called convoluted (CVL) data matrices. For FIG. 4, layer 1 represents some close range; layer i represents some intermediate range; and layer N represents some far range. It must be understood that the plots are intended to show gray-scale fading from black or near-black to white or light-gray; such fading is difficult to depict in patent drawings especially when it is gradual.

Again, the three sample plots on the right of FIG. 4 are not pictures but rather representations of data—data that in this case are normalized detector voltages. If a row in the matrix is selected according to the azimuthal component of the LOS error signals and a column of the matrix is selected according to the elevational component, then for a particular range-to-go, the value of the selected element represents the (normalized) detector's voltage potential. For values of range-to-go that are between the range-to-go values used for generating each of the layers, an intra-layer interpolation is performed by the simulator module. The three plots on the right of FIG. 4 show a trend that one would expect: for large values of range-to-go (layer N) the data shows a "fuzzy blob", and as the value of range-to-go decreases, the perceived target gets "sharper."

To review, the present invention is a real-time, hardware-in-the-loop, 6-degree-of-freedom missile simulator. It includes a simulator module which stores precomputed data loaded into the simulator module's memories. The precomputed data includes at least two layers of data matrices generated by off-line convolving target or background scene data with the particular missile's (or smart munitions') instantaneous field-of-view contour. These scene data are usually actual imagery data as measured by an imaging radiometer. These scene data can also be computer-generated using a mathematical module—a jet's infrared plume modeled as a triangle or a helicopter's ultraviolet contrast modeled as a silhouette.

Figure 5:
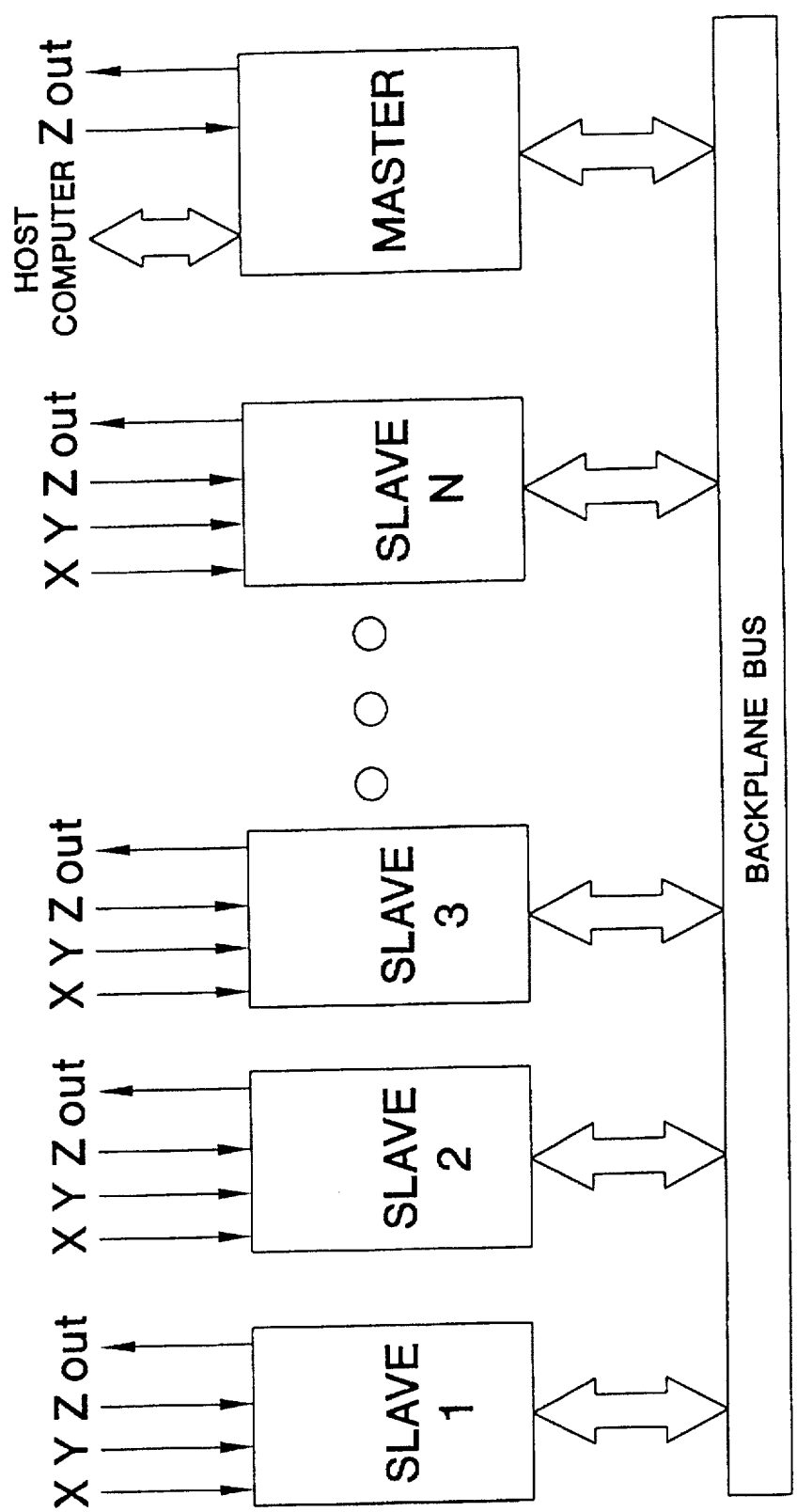
FIG. 5 is a schematic block diagram illustrating the connection of slave simulator modules to a master simulator module.

A general block diagram of a simulator module is shown in FIG. 5. Each simulator module 60 may be contained in its own rack-mountable card cage with a common 96-wire back plane bus connecting all the cards. Each simulator module 60 has one master simulator module and at least one slave simulator module. In a preferred embodiment, each master simulator module has between one and 32 slave simulator modules, each slave having an unique address (0 to 31). A dual-inline-packaged (DIP) switch sets each slave simulator module's address. Preferably, the addresses of all the slave simulator modules included in a simulator module 60 start at 0 and are contiguous. A simulator system can include a rack of up to 8 simulator modules 60 where each simulator module has an unique address. This address may also be set via DIP switches on the master simulator module. A host computer is connected to each master simulator module, preferably via a 50-pin ribbon cable. Of course, any suitable communication link may connect the master to the slaves, and the master to the host computer.

The simulator module 60 of the present invention is quite versatile and can be configured in a variety of modes. Each of the slaves in a simulator module 60 can be configured in one of three modes—independent mode, extended mode, or 4D mode. Each of these modes will be more fully described below.

If a slave is configured to operate in the independent mode, once configured and loaded, it can operate independent of the master and any other slave. The matrices of convoluted data used for each layer can be sized as $2^n \times 2^n$ where n equals 7, 8, 9, or 10. This is because, in a preferred embodiment, the total amount of memory on each slave is 2 Mb (i.e., fixed) so that there is a tradeoff between the size of each layer and the number of layers. Table A lists all the independent configurations. The rightmost column illustrates a typical simulator module configuration—one master and four slaves. The two left columns show the bit values for the five-bit slave mode and size register. If the bits labeled (a) and (b) are both reset to zero, than each independent slave uses its own version X, Y, and Z as seen in FIG. 5. This permits different target or background scenes to be modeled in different slaves, each with its own unique scaling. Other combinations of (a) and (b) allow for some of the independent slaves to share the X, Y, and Z values of one of the slaves. This may be useful if the same target or background scene was to be modeled in two different wavelength bands for a multi-detector missile system.

TABLE A

INDEPENDENT MODES

| $SM_2 SM_1 SM_0 SZ_1 SZ_0$ | | | | | Simulator Configuration with 'n' slaves | Simulator Configuration with 4 slaves |
|---|---|---|---|---|---|---|
| b | 0 | a | 0 | 0 | (n) 128 × 128 × 128 layers | (4) 128 × 128 × 128 layers |
| b | 0 | a | 0 | 1 | (n) 256 × 256 × 32 layers | (4) 256 × 256 × 32 layers |
| b | 0 | a | 1 | 0 | (n) 512 × 512 × 8 layers | (4) 512 × 512 × 8 layers |
| b | 0 | a | 1 | 1 | (n) 1024 × 1024 × 2 layers | (4) 1024 × 1024 × 2 layers |

TABLE B

EXTENDED MODES

| $SM_2 SM_1 SM_0 SZ_1 SZ_0$ | | | | | Simulator Configuration with 'n' slaves | Simulator Configuration with 4 slaves |
|---|---|---|---|---|---|---|
| c | 1 | 0 | 0 | 0 | 128 × 128 × 128n layers | 128 × 128 × 512 layers |
| c | 1 | 0 | 0 | 1 | 256 × 256 × 32n layers | 256 × 256 × 128 layers |
| c | 1 | 0 | 1 | 0 | 512 × 512 × 8n layers | 512 × 512 × 32 layers |
| c | 1 | 0 | 1 | 1 | 1024 × 1024 × 2n layers | 1024 × 1024 × 8 layers |

TABLE C

4-D MODES

| $SM_2 SM_1 SM_0 SZ_1 SZ_0$ | | | | | Simulator Configuration with 'n' slaves | Simulator Configuration with 4 slaves |
|---|---|---|---|---|---|---|
| b | 1 | 1 | 0 | 0 | 128 × 128 × 128 × n layers | 128 × 128 × 128 × 4 layers |
| b | 1 | 1 | 0 | 1 | 256 × 256 × 32 × n layers | 256 × 256 × 32 × 4 layers |

TABLE C-continued

| | | | | | 4-D MODES | |
|---|---|---|---|---|---|---|
| $SM_2$ | $SM_1$ | $SM_0$ | $SZ_1$ | $SZ_0$ | Simulator Configuration with 'n' slaves | Simulator Configuration with 4 slaves |
| b | 1 | 1 | 1 | 0 | 512 × 512 × 8 × n layers | 512 × 512 × 8 × 4 layers |
| b | 1 | 1 | 1 | 1 | 1024 × 1024 × 2 × n layers | 1024 × 1024 × 2 × 4 layers |

For Tables A, B, C:
if a = 0 then Slave uses Private X, Y, Z
a = 1 then Slave uses Public X, Y, Z
if b = 0 then Slave does not make its X, Y, Z public
b = 1 then Slave makes its X, Y, Z public
if c = 0 then Slave does not make its X and Y public
c = 1 then Slave makes its X and Y public.

If a set of two or more slaves is configured to operate in the extended mode, then the number of layers that can be modeled is increased by a factor equal to the number of slaves in the set. Table B shows this relationship. In the extended mode, one of the slaves is configured so that its X and Y inputs are used by the other slaves in the set. The Z input for the set of slaves is provided by the Z input to the master. The master controls the slaves in the set and via the back plane bus has the appropriate slaves transfer their (non-interpolated) data to the master for interpolation according to the value of the master's Z input. The result is then output via the master's output as seen in FIG. 5. A more detailed explanation of this operation will be provided below. Basically, the extended mode allows more layers to be defined for modeling the target or background scene. It should be noted that while some of the slaves can be configured as a set operating in the extended mode, other slaves can continue to operate simultaneously in the independent mode.

If a set of two or more slaves is configured to operate in the 4-D mode, than a fourth independent variable can be added to the target or background scene generation. This is where the two separate Z values (Zs and Zm) come into play. Table C shows this relationship. In the 4-D mode, one of the slaves is configured so that its X, Y, and Z inputs are used by the other slaves in the set. The fourth independent variable is input to the Z input of the master (i.e., Zm) as seen in FIG. 5. The master controls the slaves in the set and, via the back plane bus, has the appropriate slaves transfer their (interpolated) data to the master for another interpolation according to the value of the master's Z input (the fourth independent variable). The result is then output via the master's output. A more detailed explanation of this operation will be provided below.

Basically, the 4-D mode allows some slaves to operate in parallel with different memory data, where each produces an answer specified by common X, Y, and Z (i.e., Zs) values, and to have the master interpolate between these answers according to another independent Z value (Zm). This mode is useful for reticle-type missiles where the X, Y, Zs, and Zm values correspond to LOS azimuth angle, LOS elevation angle, reticle rotation angle, and range-to-target, respectively. Between its minimum and maximum value, the number of break points for the fourth variable is equal to the number of slaves in the set. It should be noted that while the extended mode and the 4-D mode are exclusive, other slaves can continue to operate simultaneously in the independent mode regardless of whether other slaves are configured in the extended mode or the 4-D mode. That is, if at least one slave is configured in the extended (or 4-D) mode, then all other slave cards configured in the 4-D (or extended) mode will be reconfigured to the former mode.

Figure 6:
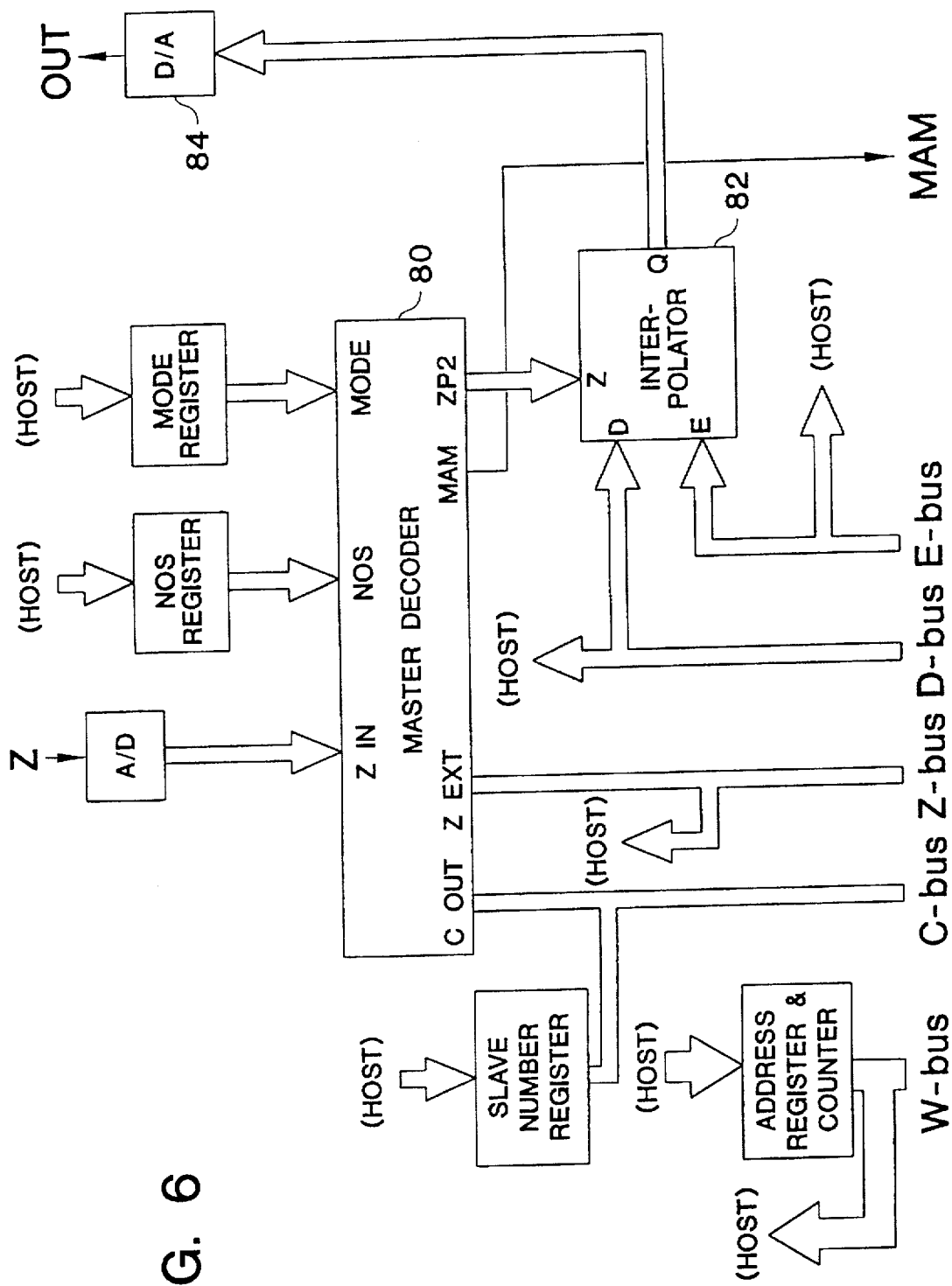
FIG. 6 is a schematic block diagram illustrating a master simulator module.
Figure 7:
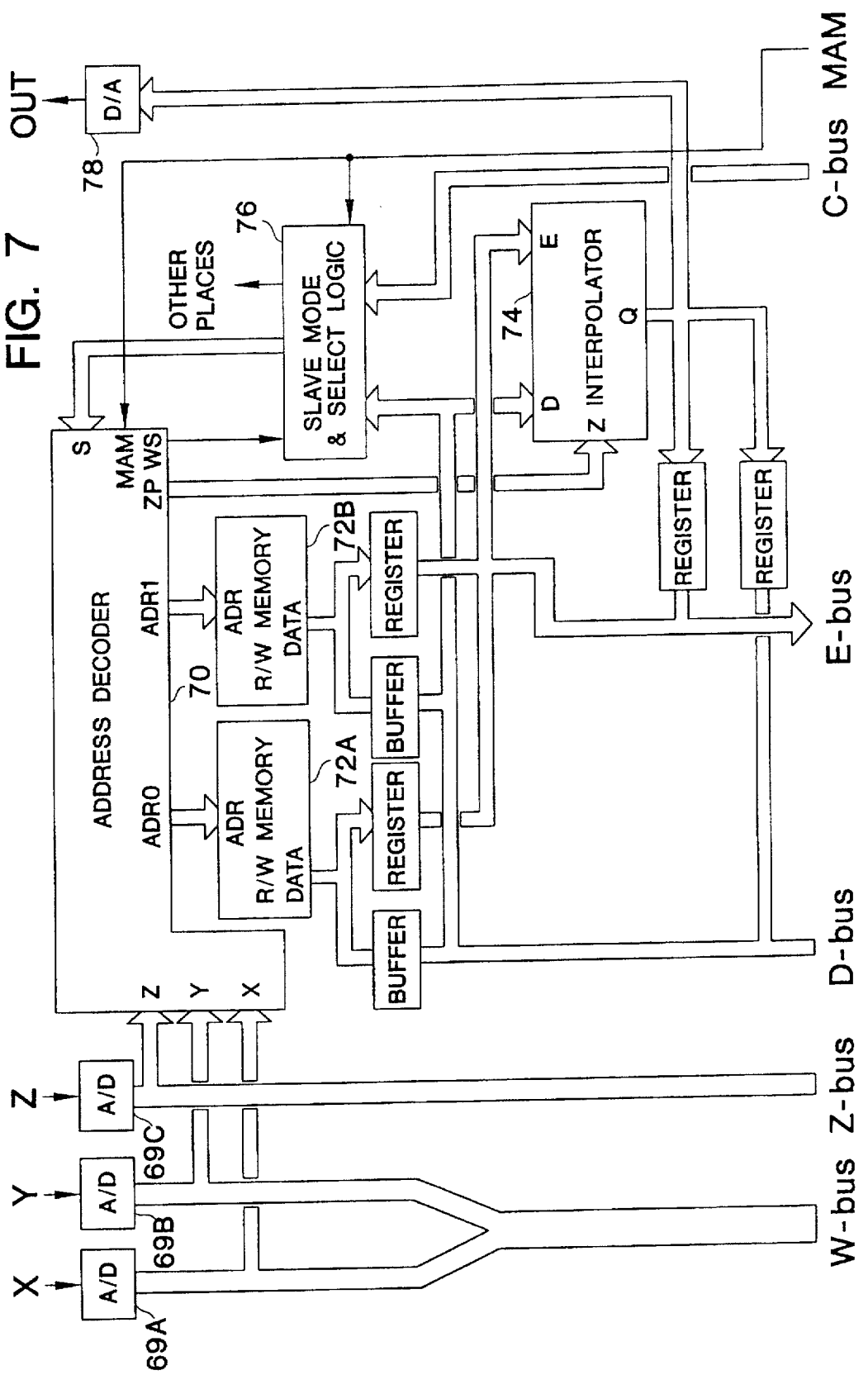
FIG. 7 is a schematic block diagram illustrating a slave simulator module.
Figure 8A:
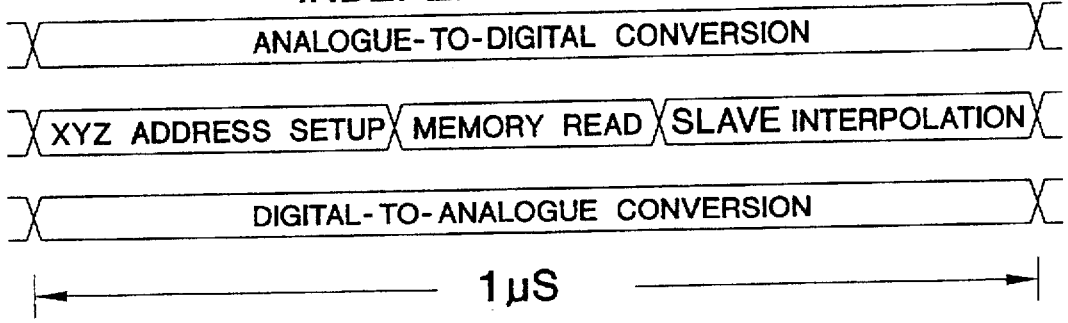
FIGS. 8(a) to 8(d) are illustrative timing diagrams for the various modes in the present invention, and for the slave read/write memory timing.
Figure 8B:
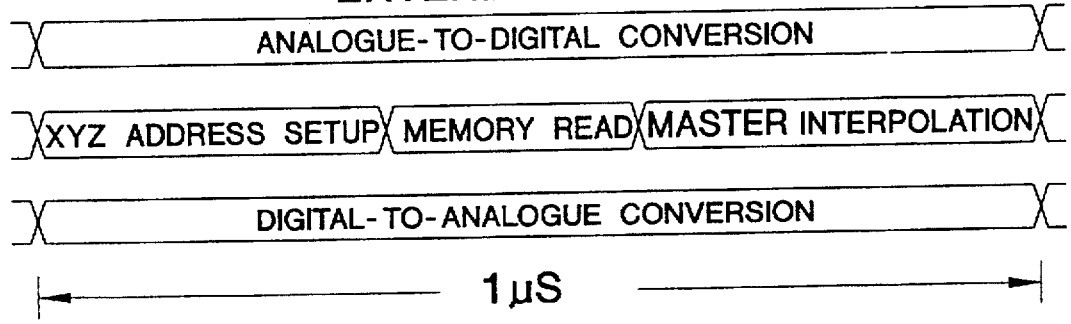
Figure 8C:
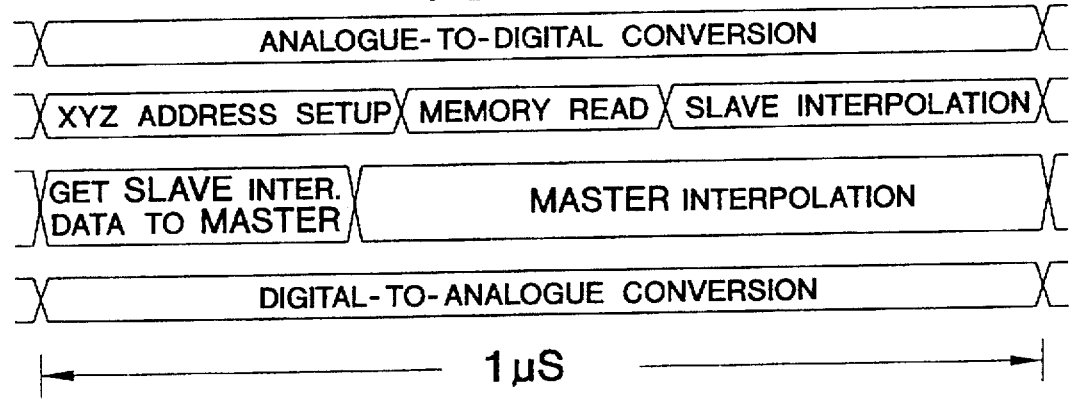
Figure 8D:
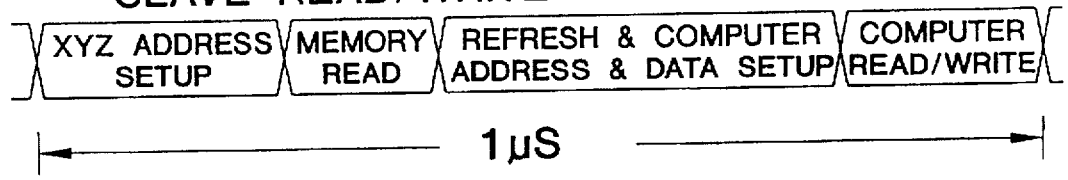

Simplified block diagrams of the master simulator module and the slave simulator module are shown in FIGS. 6 and 7, respectively. Some registers and logic are not shown for clarity. With appropriate software and hardware, the host computer is able to communicate to the master simulator module. This communication allows the host computer to select a particular simulator system and to perform the following with the selected master simulator module:

1. Load the NOS (number of slaves) register with the number of slave simulator modules (minus 1).
2. Load the MODE register on the master to configure the master.
3. Load the SLAVE number register with the address of a slave to select a particular slave.
4. Load the ADDRESS register for use in reading and writing to the slave memories.
5. Load the SLAVE MODE register on the selected slave.
6. Load the read-write memories on the selected slave.
7. Read the read-write memories on the selected slave.

Other appropriate data are available to the host computer to allow the host computer to perform diagnostic testing of the simulator system. Preferably, all communication with the host computer is performed via the 50-pin ribbon cable with 32-bits of TTL data—16 bits for output and 16 bits for input. This design allows for minimum I/O with the host. For example, for slave memory writes, three slave memory 8-bit bytes are written for every two commands from the host computer. Also, two slave memory bytes are read for every read command from the host. The addresses used for writing and reading the slave memories are preferably automatically incremented by the master. Preferably, the 16-bit parallel digital I/O board may be installed in an IBM PC®-compatible personal computer with this computer being the host computer. Upon initialization, the registers in the simulator module 60 (or plurality of simulator modules 60 if such is the case) are loaded and the simulator module memory (in the slaves) is loaded with the precomputed data from the host computer. From then on, the simulator module 60 is self-contained and requires no other host computer intervention. During a simulation flight, the simulator module 60 is fed analog signals indicating missile seeker pointing error angles, range, etc., and will then generate an analog signal that is a normalized detector signal.

In FIG. 6, the master simulator module receives or transmits information from/to the host computer demarked by the bracketed (HOST). It is to be understood that communication between the master simulator module and the host computer may occur at additional links, not shown for simplicity.

MASTER AND SLAVE OPERATION IN THE INDEPENDENT MODE

In the independent mode, once the master is used for loading the slave memory and the slave mode register, the slave no longer utilizes the master. In fact, if the slave uses its own private X, Y, and Z inputs, then the slave does not use the back plane buses. This is unique to the independent mode and that is why if a set of slaves is configured in the extended or 4-D mode, the other slaves that are not in the set can continue to operate in the independent mode.

In the independent mode (see FIG. 7), the slave's X, Y, and Z inputs are converted to 10, 10, and 12-bit digital data, respectively, that are input to the address decoder 70. If the slave is configured to make its X, Y, and Z data public (as per "b" Table A) then these data are placed on the back plane W and Z buses—via tri-state buffers not shown in FIG. 7. If the slave is to use public values of X, Y, and Z data (as per "a" Table A), then the local A/D data from converters 69A-69C are not used and the data from the W and Z buses are used. In any case, a 10-bit X value, a 10-bit Y value and a 12-bit Z value are input to the slave's address decoder 70.

The address decoder 70 utilizes these X, Y and Z data together with the slave mode data to produce the addresses for the slave pair of memories 72A and 72B. The MAM input to address decoder 70 is only utilized in the extended mode and not in the independent or 4-D modes. The address decoder 70 is a principle design feature of the slave simulator modules and will be further discussed below in more detail. The outputs of the address decoder 70 are two addresses, a word select (WS) bit, and a ZP value. The two addresses are used to access two memory locations from two adjacent layer matrices (see FIG. 4). Each memory location contains the data element corresponding to the X and Y values. The two accessed data elements are then input to D and E inputs of the interpolator 74 that interpolates between them according to the value of the Z input to the interpolator. The slave mode and select logic unit 76 receives signal WS, whose value determines which of the two memory data from memories 72A, 72B is routed to the interpolator's D and E inputs. The Z input to the interpolator 74 is driven by the ZP output of the address decoder 70. The output of the interpolator, Q, is then input to a D/A converter 78 whose analog output is the output of the slave, and may be used as the normalized detector signal 42 if used as the ultimate output of the simulator module 60.

Summarizing, as described above, the X and Y values (from the slave inputs or from the back plane bus) select an element from two adjacent matrices stored in the slave memory 72A, 72B. The two matrices are selected based on the value of the Z signal (from the slave input or from the back plane bus). The output of the slave is calculated by interpolating between these two elements according to this Z value.

According to the value of a slave mode register and as listed in Table A, the size of the matrix for each layer can be 128×128, 256×256, 512×512, or 1024×1024. Accordingly, 7, 8, 9, or 10 bits from each of the X and Y values are used by the address decoder 70 to form part of the addresses generated by the decoder. Each matrix is stored alternately in the two slave memories—the even layers are stored in memory 72A and the odd layers in memory 72B, for example. Thus with proper decoding, the elements from two adjacent matrices can be accessed from the slave memories simultaneously. The address decoder 70 selects the appropriate two adjacent matrices for the particular value of Z. The value of the WS output of the decoder, with additional logic not shown, then routes the element from the matrix corresponding to the lesser value of Z to the D input of the interpolator 74, and the element from the matrix corresponding to the greater value of Z to the E input of the interpolator 74.

If the slave is modeling two layers of 1024×1024 elements then the address decoder's operation is simple. The matrix layer corresponding to Z equal to 0 is stored in the memory 72A, for example. The other matrix layer corresponding to Z equal to full scale is stored in the memory 72B. All 10 X and Y bits are concatenated to form the required 20-bit addresses for the memories. In this case, the two addresses generated by the decoder 70 are identical. Furthermore, the decoder 70 produces a value of 0 for the WS signal so that the data from the two memories are routed to the D and E inputs of the interpolator, respectively. The 8 most significant bits (MSBs) of the Z input to the decoder are output from the decoder 70 as ZP and are used as the Z input of the interpolator 74.

If the slave is configured in any of the other three modes—512×512×8 layers, 256×256×32 layers, or 128× 128×128 layers—than the operation of the decoder 70 is much more complicated. Mathematically, the reason is because only with the 2-layer configuration is the number of intra-layer intervals (which is equal to the number of layers minus one) a power of two. For the other three configurations, the number of layers are 8, 32, and 128 and the number of intervals 7, 31 and 127 respectively. The following explanation will explain the method used by the address decoder 70 for the 256×256×32-layer configuration. The other configurations could be explained similarly.

With the 256×256×32-layer configuration, the 8 MSBs of the X input and the 8 MSBs of the Y input are concatenated together to form the 16 least significant bits (LSBs) of memory addresses. This part of the address selects which element of a given layer is selected. The remaining 4 MSBs of the addresses select which of the layers are selected. The 4-bits can select one of 16 layers—one of 16 even-numbered layers for the memory 72A, and one of 16 odd-numbered layers for the memory 72B. By storing 16 layers in each of the two memories, a total of 32 layers are stored.

The slave selects the two layers that "surround" the Z value and then interpolates between them by scaling Z into signal ZP which is used by interpolator 74. In this configuration, there are 31 possible intervals that Z corresponds to, and thus 31 different addresses and values of WS, that the address decoder 70 must produce. Table D illustrates this.

TABLE D

| Z/full scale | 4 MSBs of ADR0 (layer) | 4 MSBs of ADR1 (layers) | WS | ZP/full scale |
|---|---|---|---|---|
| 0/31 to 1⁻/31 | 0 | 1 | 0 | 0 to 1⁻ |
| 1/31 to 2⁻/31 | 2 | 1 | 1 | 0 to 1⁻ |
| 2/31 to 3⁻/31 | 2 | 3 | 0 | 0 to 1⁻ |
| 3/31 to 4⁻/31 | 4 | 3 | 1 | 0 to 1⁻ |
| 4/31 to 5⁻/31 | 4 | 5 | 0 | 0 to 1⁻ |
| . | . | . | . | . |
| . | . | . | . | . |
| 30/31 to 31⁻/31 | 30 | 31 | 1 | 0 to 1⁻ |

Once the correct elements are read from the slave memories, the elements are routed to the (appropriate, as per WS) D and E inputs in the interpolator 74. The interpolator then interpolates between these two values according to the value of ZP output from the address decoder 70. The ZP output is a function of the Z input to the address decoder 70 as per Table D. Finally, the interpolator output Q is routed to a D/A converter 78 which is the output of the slave.

So as the Z input to the address decoder 70 varies from its minimum to maximum potential, the output of the slave will represent a linear interpolation between the elements selected by X and Y from adjacent matrices. The X and Y inputs specify the row and column of a particular matrix, and the Z input specifies which layers (and interpolation between layers). Because in the preferred embodiment a fixed amount of data is used in each slave simulator module, as the precision in X and Y increases, the number of layers decreases.

OPERATION IN THE EXTENDED MODE

If a set of two or more slave simulator modules is configured in the extended mode, then these slaves will work in concert with the master simulator module to extend the number of layers in a particular scenario by a factor equal to the number of slaves in the set. Table B illustrates this. In the extended mode, one of the slaves in the set is selected to make its X and Y values public and to place them on the back plane W-bus (see "c" values). The X and Y values will be used by all the other slaves in the set. The Z inputs to the slaves (FIG. 7) are not used, but instead the Z input to the master (FIG. 6) is used. The value of the master's Z input and the value in the register specifying the number of slaves in the set (actually the number of slaves in the set minus 1), and the contents of a MODE register on the master are input to the master decoder 80 in the master.

Assume that the value of the Z input on the master is such that it lies between the Z values associated with two layers that are stored in the memories on the same slave. In this case, the master decoder will assign a value of 0 for the back plane MAM (maximum and minimum) signal and generate an appropriate value for Zext which is placed on the back plane bus and used by all the slaves in the set as the Z input to their respective address decoders 70. In addition, the master decoder 80 will generate the number of the slave in which the two layers reside, and place that number on the C bus. The slave logic is such that in the extended mode, if the value on the C bus matches the address of the slave, that slave will output its appropriately addressed (and routed via the WS signal) memory data to the back plane D bus and E bus instead of to the D and E inputs of the interpolator 74, respectively. These values are then input to the master interpolator 82 on the master. The Z input to the master interpolator 82 is driven by a ZP2 value generated by the master decoder 80. The output of the master interpolator 82 is then routed to a D/A converter 84 whose output is the output of the master.

On the other hand, if the value of the Z input on the master is such that it lies between the Z values associated with two layers that are stored in the memories different slaves, then the master decoder 80 will place a value of 1 for the MAM signal, and the address of the lower-numbered slave on the back plane C bus. The value of Zext generated by the master decoder 80 is irrelevant in this case. If the value of MAM is 1, than the address decoders on the slaves that are operating in the extended mode will: (1) generate values for addressing memory 72A as if the Z input to the decoder 70 was 0, or at its minimum; (2) generate values for addressing memory 72B as if the Z input to the decoder 70 was full scale, or at its maximum; (3) if the value on the C bus matches the address of the slave, then the slave will enable the data from its memory 72B to be placed on the back plane D bus; and (4) if the value on the C bus is 1 less than the address of the slave, then the slave will enable the data from its memory 72A to be placed on the back plane E bus. The remainder of the simulator module 60 operation is as described above.

For example, assume a set of three slaves are to be configured in the extended mode to simulate a target or background scene using twenty-four (24) 512×512 element layers (n=3 in Table B). In this case, the host computer would (1) load the master's NOS register with a value of 2 (which equals the number of slaves in the set minus 1); (2) load the master's mode register with the appropriate value to signify the extended mode and 512×512 layers; (3) load the mode register of one of the slaves in the set to signify the extended mode, 512×512 element layers, and to make this slave's X and Y data public; and (4) load the mode registers on all the other slaves in the set to signify the extended mode, 512×512 element layers and to have the slave use the public values X and Y. See Table B. The hardware in the simulator module 60 will automatically set all the other slaves (if any are not used in the set) to the independent mode, and not to make its X and Y values public. Table E lists what the master decoder 80 would generate.

TABLE E

| MASTER Zin/full scale | Cout | MAM | MASTER Zext/full scale | MASTER ZP/full scale |
|---|---|---|---|---|
| 0/23 to 1⁻/23 | 0 | 0 | 0/7 to 1⁻/7 | 0 to 1⁻ |
| 1/235 to 2⁻/23 | 0 | 0 | 1/7 to 2⁻/7 | 0 to 1⁻ |
| . | . | . | . | . |
| . | . | . | . | . |
| . | . | . | . | . |
| 6/23 to 7⁻/23 | 0 | 0 | 6/7 to 7⁻/7 | 0 to 1⁻ |
| 7/23 to 8⁻/23 | 0 | 1 | (not used) | 0 to 1⁻ |
| 8/23 to 9⁻/23 | 1 | 0 | 0/7 to 1⁻/7 | 0 to 1⁻ |
| 9/230 to 10⁻/23 | 1 | 0 | 1/7 to 2⁻/7 | 0 to 1⁻ |
| . | . | . | . | . |
| . | . | . | . | . |
| . | . | . | . | . |
| 14/23 to 15⁻/23 | 1 | 0 | 6/7 to 7⁻/7 | 0 to 1⁻ |
| 15/23 to 16⁻/23 | 1 | 1 | (not used) | 0 to 1⁻ |
| 16/23 to 17⁻/23 | 2 | 0 | 0/7 to 1⁻/7 | 0 to 1⁻ |
| 17/235 to 18⁻/23 | 2 | 0 | 1/7 to 2⁻/7 | 0 to 1⁻ |
| . | . | . | . | . |
| . | . | . | . | . |
| . | . | . | . | . |
| 22/23 to 23⁻/23 | 2 | 0 | 6/7 to 7⁻/7 | 0 to 1⁻ |

It must be noted that although most of the logic in the master decoder 80 and the slave address decoder 70 is preferably implemented read-only memory (or memories), care must be exercised in the data to be stored in this memory. Note also that the fractional values in Tables D and E have denominators that are not powers of 2 (or even, for that matter). Therefore, when a break point between the first two rows in Table E is designed, the break between 1/23 and 1/23 for Zin/full scale and the break between 1/7 and 1/7 for Zext/full scale and the break between 1 and Q for ZP/full scale must all be made at the same occurrence.

OPERATION IN THE 4-D MODE

If a set of two or more slave simulator modules is configured in the 4-D mode, then these slaves will work in concert with the master and add a fourth independent variable to the scene being generated by the simulator 60. Table C illustrates this. In the 4-D mode, one of the slaves in the set is selected to make its X, Y, and Z values public and to place them on the back plane W bus and Z bus. These values will be used by all the other slaves in the set. Each slave then computes an answer as described above in the section describing the independent mode. But if the address of the slave matches the value placed on the back plane C bus by the master, then the slave will place its answer on the back plane D bus. If the address of the slave is one more than the value placed on the back plane C bus by the master, then the slave will place its answer on the back plane E bus. These values from the back plane D bus and E bus are then input to the D and E inputs of the master's interpolator 82, respectively.

The value of the master's Z input provides the fourth independent variable to the scene. This master Z input value and the value in a register specifying the number of slaves in the set (actually, the number of slaves in the set minus 1), and the contents of a mode register on the master are input to the master decoder 80 in the master. The master decoder 80 produces the value that is placed on the back plane C bus and the ZP2 value that is input to the Z input of the master's interpolator 82. The output of the master interpolator 82 is routed to the D/A converter 84 to produce the output signal for the simulator module 60.

Basically, in the 4-D mode, each slave in a set of slaves selects a particular element in the layered data stored in the slave's memories. The particular element is defined by the X and Y values on a particular slave in the set. The Z value (Zs) on this particular slave determines the interpolation values used to interpolate between these elements (from each layer) on each slave to produce a value on each slave that is a function of these X, Y, and Z inputs. As indicated above, this allows some slaves to operate in parallel with different memory data. Where each produces an answer specified by common X, Y, and Z values and to have the master interpolate between these answers according to another independent variable. The value of the master's Z input (Zm) is this fourth independent variable. It is used by the master decoder 80 to produce interpolation values between the values that are produced by the slaves. This provides the fourth dimension to the scene generation.

For example, assume a set of six slaves is to be configured in the 4-D mode to simulate a target or background scene described by (6×32) 256×256 element layers. In this case, the host computer will (1) load the master's NOS register with a value of 5 (which equals the number of slaves in the set minus 1); (2) load the master's mode register with the appropriate value to signify the 4-D mode and 256×256 layers; (3) load the mode register of one of the slaves in the set to signify the 4-D mode, 256×256 element layers and to make this slave's X, Y, and Z data public; and (4) load the mode registers on all the other slaves in the set to signify the 4-D mode, 256×256 element layers and to have the slave use the public values for X, Y, and Z. The hardware of the simulator module 60 will automatically set all the other slaves (if any are not in the set) to the independent mode and not to make its X, Y, and Z values public. Table F lists what the master decoder would generate.

TABLE F

| MASTER Zin/full scale | Cout | MASTER ZP/full scale |
|---|---|---|
| 0/5 to 1⁻/5 | 0 | 0 to 1⁻ |
| 1/5 to 2⁻/5 | 1 | 0 to 1⁻ |
| 2/5 to 3⁻/5 | 2 | 0 to 1⁻ |
| 3/5 to 4⁻/5 | 3 | 0 to 1⁻ |
| 4/5 to 5⁻/5 | 4 | 0 to 1⁻ |

TIMING

The architecture of the simulator module 60 is pipelined to allow parallel operations to occur simultaneously. FIG. 8 illustrates the timing of the simulator module 60 for each of the three modes in addition to the slave memory timing. In a preferred embodiment, the read/write memories on the slave simulator modules are pseudo-static 1Mb×8-bit memory integrated circuits, and time must be allotted for their refreshing as FIG. 8 shows. Each pipelined stage is performed in 1 µS, and the independent mode, extended mode, and 4-D mode utilize 3, 3, and 4 stages, respectively. Thus, a new value is output by the simulator module 60 every 1 µS and a change on any input will produce a change in the output 3 or 4 µS later.

The interpolators used in the present invention may be any suitable high-speed interpolator. Because of their speed, hardware bi-polar logic multipliers are preferred.

To summarize, the simulator module system is an all-electronic device that can produce (normalized) detector signal(s) for target and/or background scenes. Data to define the scene to be modeled are stored in memories on the slave cards. These data are then accessed and manipulated independent of the master (in the independent mode) or in concert with the master (in the extended or 4-D modes) to produce the required output. Since the device is all electronic, there are no wavelength-dependent terms so thus the simulator module 60 can be used to generate IR, visible, I/V, I/V-contrast, and other electro-optical scenes. The simulator module 60 could also be used with radio frequency scenes for missiles (or other smart munitions) operating in that portion of the spectrum. It can readily be seen that the advantages of the present invention include an almost all digital design which is very stable. It is wavelength band independent, capable of working with any general purpose digital computer as a host, independent of the host once initialized, capable of working with single or multi-detector seekers, capable of working with reticle or imaging seekers. In the preferred embodiment, it is very economical compared to other methods, expandable, and small, occupying less than ten inches of panel height in a 19-inch rack.

SLAVE ADDRESS DECODER

As described above, the slave simulator's address decoder 70 is an unique set of logic. It was designed and is preferably implemented using Erasable Programmable Read-Only Memories (EPROMs). The address decoder 70 generates the appropriate addresses for the slave's memories and generates the appropriate value for the Z input to the slave's interpolator 74. These outputs depend on the values of the address decoder's X, Y and Z inputs. These outputs also depend upon the configuration of the slave the size and number of layers stored in the slave memories. This configuration is defined by 2 bits from the slave mode register—$SZ_0$ and $SZ_1$. Table G lists the correspondence between these two bits and the configuration of the data in the slave memories.

TABLE G

| bit $SZ_1$ | bit $SZ_0$ | SLAVE memory configuration |
|---|---|---|
| 0 | 0 | 128 × 128 × 128 layers |
| 0 | 1 | 256 × 256 × 32 layers |
| 1 | 0 | 512 × 512 × 8 layers |
| 1 | 1 | 1024 × 1024 × 2 layers |

Although FIG. 7 illustrates a simplified diagram of the slave address decoder 70, a more detailed illustration is shown in FIG. 9. The uniqueness of the decoder lies in the topology of the data buses and the contents of the two EPROMs—the SADR and the SZP EPROMs. The actual contents of the two EPROMs are defined by two FORTRAN subroutines listed in Appendix 1 and Appendix 2. For both subroutines, the first argument IADR, is the integer address and is passed from the calling program to the subroutine. The second address, IDATA, is what the contents of the EPROM should be and is passed from the subroutine to the calling program.

The SADR EPROM is preferably a 64K×16-bit memory. Only 13 of the 16 data bits are used. For the simulator module, a TC57H1024D-85 integrated circuit by Toshiba may be used. The SZP EPROM is preferably a 16K by 8-bit memory, and may be a 27128AF1 integrated circuit manufactured by SGS-Thomson. The following describes the operation of the SADR EPROM.

When $SZ_1$, $SZ_0$ is 1,1 (1024×1024×2 layers), the values on $A_{00}$ through $A_{00}$ are concatenated with the values on $A_{03}$ through $A_{05}$ to produce the 6 LSBs for both outputs $ADR_0$ ($D_{00}$ through $D_{05}$) and $ADR_1$ ($D_{06}$ through $D_{11}$). The 7 bits of Z information in $A_{06}$ through $A_{12}$ are not used. The MAM signal on $A_{13}$ is not used. The WS output on $D_{12}$ is reset to 0.

When $SZ_1$, $SZ_0$ is 1,0 (512×512×8 layers), the values on $A_{01}$ through $A_{02}$ are concatenated with the values on $A_{04}$ through $A_{05}$ to produce the 4 LSBs for both outputs $ADR_0$ ($D_{00}$ through $D_{03}$) and $ADR_1$ ($D_{06}$ through $D_{09}$). The 7 bits of Z information in $A_{06}$ through $A_{12}$ are used with the MAM signal on $A_{13}$ to generate the WS output on $D_{12}$ and the 2 MSBs for both outputs $AD_0$ ($D_{04}$ through $D_{05}$) and $ADR_1$ ($D_{10}$ through $D_{11}$).

When $SZ_1$, $SZ_0$ is 0,1 (256×256×32 layers), the value on $A_{02}$ is concatenated with the value on $A_{05}$ to produce the 2 LSBs for both outputs $ADR_0$ ($D_{00}$ through $D_{01}$) and $ADR_1$ ($D_{06}$ through $D_{07}$). The 7 bits of Z information in $A_{06}$ through $A_{12}$ are used with the MAM signal on $A_{13}$ to generate the WS output on $D_{12}$ and the 4 MSBs for both outputs $ADR_0$ ($D_{02}$ through $D_{05}$) and $ADR_1$ ($D_{08}$ through $D_{11}$).

When $SZ_1$, $SZ_0$ is 0,0 (128×128×128 layers), the values on $A_{00}$ through $A_{05}$ are not used. The 7 bits of Z information in $A_{06}$ through $A_{12}$ are used with the MAM signal on $A_{13}$ to generate the WS output on $D_{12}$ and all 6 bits for both outputs $ADR_0$ ($D_{00}$ through $D_{05}$) and $ADR_1$ ($D_{06}$ through $D_{11}$).

The slave address decoder 70 was designed for minimal hardware at the expense of software requirements for the generation of the data to be placed in the slave memories. Simply stated, the hardware scrambles the memories' address bits and the scrambling is a function of the configuration of the slave. From the point of view of the host computer (and software), the two slave memories 72A, 72B are considered as one memory that contains 2 Mb of data and the address space of this memory is 0 to 2,097,152. This requires a 21-bit address. As described above, the slave memory contains data for $2^K$ layers where each layer consists of $2^M \times 2^M$ elements—$2^M$ rows×$2^M$ columns. Thus (K+M+M)=21. Thus each datum in the memory has an unique combination of a layer address, a row address, and a column address. Ideally, one would prefer to access this memory in a linear fashion, similar to the scheme used by high-level programming languages in accessing a multi-dimensional matrix. In this ideal fashion the 21-bit memory address could be written:

$$A_{20}, A_{19} \ldots A_{00} = Z_{K-1}, Z_{K-2} \ldots Z_0, Y_{M-1}, Y_{M-2} \ldots Y_0, X_{M-1}, X_{M-2} \ldots X_0$$

where $A_i$ is the i-th address bit, $Z_i$ is the i-th layer address, $Y_i$ is the i-th row address, and $X_i$ is the i-th column address.

As stated above, because of the hardware, the mapping of $Z_i$, $Y_j$, and $X_k$ into $A_n$ varies with the configuration. In the 1024×1024×21 layer configuration, the 21-bit address mapping is:

$$A_{20}, A_{19} \ldots A_{00} = Z_0 Y_9 Y_8 Y_7 Y_6 Y_5 Y_4 Y_3 Y_2 Y_1 Y_0 X_9 X_8 X_7 X_6 X_5 X_4 X_3 X_2 X_1 X_0$$

In the 512×512×81 layer configuration, the 21-bit address mapping is:

$$A_{20}, A_{20} \ldots A_{00} = Z_0 Y_8 Y_7 Y_6 Y_5 Y_4 Y_3 Y_2 Z_2 Z_1 Y_1 X_8 X_7 X_6 X_5 X_4 X_3 X_2 X_0 X_1 X_0$$

In the 256×256×32 layer configuration, the 21-bit address mapping is:

$$A_{20}, A_{19} \ldots A_{00} = Z_0 Y_7 Y_6 Y_5 Y_4 Y_3 Y_2 Y_1 Z_4 Z_3 Z_2 X_7 X_6 X_5 X_4 X_3 X_2 X_1 Z_1 Y_0 X_0$$

In the 128×128×128 layer configuration, the 21-bit address mapping is:

$$A_{20}, A_{19} \ldots A_{00} = Z_0 Y_6 Y_5 Y_4 Y_3 Y_2 Y_1 Y_0 Z_6 Z_5 Z_4 X_6 X_5 X_4 X_3 X_2 X_1 X_0 Z_3 Z_2 Z_1$$

Additional information on generation of the additional (or all the) bits of $ADR_0$ and $ADR_1$ (via the SADR EPROM) in addition to the generation of ZP (via the SZP EPROM) is provided above in the main discussion of the present invention. Examples for the various configurations are discussed and tables are provided to demonstrate this generation.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

APPENDIX 1

SLAVE Address Decoder SADR EPROM Data Definition.

```
*#      SUBROUTINE SADR_EPROM (IADR,IDATA)
*
*       *****
*       *****
*
*       SUBROUTINE SADR_EPROM (IADR,IDATA)
*
        ISZ=JIBITS(IADR,14,2)
        MAM=JIBITS(IADR,13,1)
        IZ=JIBITS(IADR,6,7)
        J=2**(7 - 2*ISZ) - 1
        K=IZ*J/128
        IF (MAM.EQ.0) THEN
           M=(K+1)/2
           N=K/2
           ISW=JIBITS(K,0,1)
        ELSE
           M=0
           N=J/2
           ISW=1
        ENDIF
        IF (ISZ.EQ.0) THEN
           MM=M
           NN=N
        ELSEIF (ISZ.EQ.1) THEN
           MM=M* 4+JIBITS(IADR,5,1)*2+JIBITS(IADR,2,1)
           NN=N* 4+JIBITS(IADR,5,1)*2+JIBITS(IADR,2,1)
        ELSEIF (ISZ.EQ.2) THEN
           MM=M*16+JIBITS(IADR,4,2)*4+JIBITS(IADR,1,2)
           NN=N*16+JIBITS(IADR,4,2)*4+JIBITS(IADR,1,2)
        ELSE
           MM=JIBITS(IADR,0,6)
           NN=JIBITS(IADR,0,6)
        ENDIF
        IDATA=ISW*4096+NN*64+MM
        RETURN
        END!
```

APPENDIX 2

SLAVE Address Decoder SZP EPROM Data Definition.

```
*#    SUBROUTINE SZP_EPROM (IADR,IDATA)
*
*     *****
*     *****
*     *****
*
      SUBROUTINE SZP_EPROM (IADR,IDATA)
*
      ISZ=JIBITS(IADR,12,2)
      IZIN=JIBITS(IADR,0,12)
      J=2**(7 - 2*ISZ) - 1
*
*.....old way, ignoring SADR EPROM
*     K=IZIN*J/4096
*     IDATA=(IZIN*J - K*4096)/16
*
*.....new way, taking SADR EPROM into account
      IZIN7=IZ1N/32
      K1=IZIN7*J/128
      K2=K1+1
*     (the following line was replaced with the next 5 lines
*     on 24 March 1994)
*     KK1=(K1*128/J)*32
      IF (K1.EQ.0) THEN
          KK1=(K1*128/J )*32
      ELSE
          KK1=(K1*128/J+1)*32
      ENDIF
      KK2=(K2*128/J)*32+31
      IDATA=(IZ1N - KK1)*256/(KK2 - KK1+1)
*
      RETURN
      END!
```

What is claimed is:

1. An analog function simulator comprising:

memory storage means for storing at least two data matrices;

an address decoder operatively connected to said memory storage means, for generating address signals for accessing at least two elements from the stored data matrices; and first interpolator means for interpolating between the at least two elements accessed by said address decoder and for producing a first interpolated result;

wherein the analog function simulator further comprises:

at least one second memory storage means for storing at least two data matrices;

at least one second address decoder, each operatively connected to a respective second memory storage means, for generating address signals for accessing at least two elements from the data matrices stored in the respective second memory storage means;

at least one second interpolator means for interpolating between the at least two elements accessed by a respective second address decoder and for producing a second interpolated result;

a communications link operatively connected to each of said first and second interpolator means;

a plurality of selector means, each operatively connected to a respective one of said first and second interpolator means, for selectively placing the respective first or second interpolated result onto said communications link; and a master simulator module operatively connected to said communications link for receiving two interpolated results placed on the communications link, said master simulator module including, third interpolator means for receiving the two received interpolated results and a second variable signal, said third interpolator means interpolating between the two received interpolated results based upon the value of the second variable signal and producing a third interpolated result; and second conversion means for receiving the third interpolated result and for generating a second analog interpolated signal.

2. An analog function simulator comprising:

memory storage means for storing at least two data matrices;

an address decoder operatively connected to said memory storage means, for generating address signals for accessing at least two elements from the stored data matrices; and first interpolator means for interpolating between the at least two elements accessed by said address decoder and for producing a first interpolated result;

wherein the analog function simulator further comprises:

at least one second memory storage means for storing at least two data matrices;

at least one second address decoder, each operatively connected to a respective second memory storage means, for generating address signals for accessing at least two elements from the data matrices stored in the respective second memory storage means;

a communications link operatively connected to said first and second memory storage means;

a plurality of selector means, each operatively connected to a respective one of said first and second memory storage means, for selectively placing at least one accessed element onto said communications link; and a master simulator module operatively connected to said communications link for receiving two accessed elements placed on said communications link, said master simulator module including, third interpolator means for receiving the two received elements and a second variable signal, said third interpolator means interpolating between the two received elements based upon the value of the second variable signal and producing a third interpolated result; and second conversion means for receiving the third interpolated result and for generating a second analog interpolated signal.

3. An analog function simulator for simulating a detector signal of a target detector assembly in an object, comprising:

means for producing at least a range signal representative of the range between the object and the target, and error signals representative of the difference between the location of the target and a direction in which the target detector assembly is looking;

first memory storage means for storing at least two data matrices representative of scene data for predetermined respective ranges between the object and the target;

an address decoder operatively connected to said memory storage means and receiving the range signal and the error signals, for generating address signals for accessing at least two elements from the stored data matrices;

first interpolator means for interpolating between the at least two elements accessed by said address decoder and for producing a first interpolated result; and first conversion means for receiving the first interpolated result and for generating a first analog interpolated signal wherein;

the analog function simulator further comprises:

at least one second memory storage means for storing at least two data matrices;

at least one second address decoder, each operatively connected to a respective second memory storage means, for generating address signals for accessing at least two elements from the data matrices stored in the respective second memory storage means;

at least one second interpolator means for interpolating between the at least two elements accessed by a respective second address decoder and for producing a second interpolated result;

a communications link operatively connected to each of said first and second interpolator means and to each of said first and second memory storage means;

a plurality of selector means, each operatively connected to a respective one of said first and second interpolator means for selectively placing the respective first or second interpolated result onto said communications link, and each operatively connected to a respective one of said first and second memory storage means, for selectively placing at least one accessed element onto said communications link; and a master simulator module operatively connected to said communications link for selectively receiving two interpolated results placed on the communications link or two accessed elements placed on said communications link, said master simulator module including, third interpolator means for selectively receiving the two received interpolated results or the two received elements, and for receiving a second variable, said third interpolator means selectively interpolating between the two received interpolated results based upon the value of the second variable signal or interpolating between the two received elements based upon the value of the second variable signal, and producing a third interpolated result; and second conversion means for receiving the third interpolated result and for generating a second analog interpolated signal.

* * * * *